United States Patent [19]

Nadkarni et al.

[11] Patent Number: 4,948,573

[45] Date of Patent: Aug. 14, 1990

[54] PROCESS FOR PRODUCING SILICON CARBIDE AND METAL CARBIDES

[75] Inventors: Sadashiv Nadkarni; Mukesh Jain; Jean-Paul Huni, all of Jonquiere, Canada

[73] Assignee: Alcan International Limited, Montreal, Canada

[21] Appl. No.: 355,033

[22] Filed: May 16, 1989

Related U.S. Application Data

[63] Continuation of Ser. No. 126,777, Nov. 30, 1987, abandoned.

[30] Foreign Application Priority Data

Dec. 2, 1986 [CA] Canada .................................. 524364
Jul. 2, 1987 [CA] Canada .................................. 541167

[51] Int. Cl.$^5$ ...................... C01B 31/36; C01B 31/30; C01B 31/34
[52] U.S. Cl. .................................. 423/291; 423/345; 423/439; 423/440; 501/87; 501/88
[58] Field of Search ............... 423/345, 439, 440, 291; 501/87, 88

[56] References Cited

U.S. PATENT DOCUMENTS

| | | | |
|---|---|---|---|
| 3,403,008 | 9/1968 | Hamling | 23/344 |
| 3,932,594 | 1/1976 | Gortsema | 501/87 |
| 3,947,550 | 3/1976 | Fitchmun | 423/345 |
| 4,126,652 | 11/1978 | Oohara et al. | 423/440 |
| 4,190,439 | 2/1980 | Gortsema | 423/439 |
| 4,284,612 | 8/1981 | Horne et al. | 423/345 |
| 4,410,502 | 10/1983 | Yamaguchi et al. | 423/345 |
| 4,444,894 | 4/1984 | Shaver | 501/90 |
| 4,460,697 | 7/1984 | Hara et al. | 423/409 |
| 4,515,763 | 5/1985 | Boudart et al. | 423/409 |
| 4,529,575 | 7/1985 | Enomoto et al. | 423/345 |

FOREIGN PATENT DOCUMENTS

| | | |
|---|---|---|
| 2136288 | 7/1970 | Fed. Rep. of Germany . |
| 52-150416 | 6/1976 | Japan . |
| 52-103408 | 7/1976 | Japan . |
| 54-125200 | 9/1979 | Japan . |
| 56-17910 | of 1981 | Japan . |
| 2162504A | 2/1986 | United Kingdom . |

OTHER PUBLICATIONS

U.S. Application Ser. No. 541,188, 12/7/84 (Chemical Abstracts 102:977336).
Oak Ridge National Laboratory–Carbothermal Synthesis of Silicon Carbide Janney, et al.–May 1985.
Synthesis of Sinterable SiC Powders by Carbothermic Reduction of Gel–Derived Precursors and Pyrolysis of Polycarbosilane–Wei, et al.–vol. 63, No. 8 (1984).
"ORLON" Acrylic Fiber: Chemistry and Properties–R. C. Houtz Textile Research Journal, Nov. 1950.

Primary Examiner—John Doll
Assistant Examiner—Lori F. Cuomo
Attorney, Agent, or Firm—Cooper & Dunham

[57] ABSTRACT

A process for forming carbides of silicon or metals in fine powder or whisker form. The process comprises forming a substantially uniform and non-agglomerated dispersion of a microfine powder of an oxide of silicon or a carbide-forming metal within a matrix of a polymer, carbonizing the oxide-containing polymer in an inert atmosphere and heating the carbonized product at high temperature to cause the oxide to react with carbon to form a carbide. The polymer must have a molecular weight of at least 10,000, a high carbon yield of at least 30% by weight, and a chemical structure which is infusible or capable of being rendered infusible. The preferred polymers are polyacrylonitrile, cellulose and polyvinyl alcohol, but other polymers with similar characteristics can be employed. The process is relatively inexpensive and gives an extremely finely divided product of high purity.

20 Claims, 7 Drawing Sheets

PROCESS FOR PRODUCING SILICON CARBIDE AND METAL CARBIDES

This is a continuation of application Ser. No. 07/126,777. filed Nov. 30, 1987 now abandoned.

BACKGROUND OF THE INVENTION

I. FIELD OF THE INVENTION

This invention relates to a process for the formation of silicon carbide and carbides of various metals, for example aluminum, boron, tantalum, titanium, zirconium, hafnium, yttrium, lanthanum, chromium, niobium, molybdenum, tungsten and vanadium, etc. More particularly, the invention relates to a process for producing such carbides in the form of fine powders or whiskers.

II. DESCRIPTION OF THE PRIOR ART

Carbides of silicon and various metals are well known and are generally characterized by high hardness, which makes them useful in a variety of applications. For example, tungsten carbide is used in large quantities for the preparation of cutting tools. Recently, interest has focussed on the production of carbides in the form of fine powders or whiskers, which are now being used, for example, for the fabrication of sintered bodies and components in the electronics and engineering industries and for the reinforcement of high melting point materials, such as ceramics, aluminum and other metals.

Tungsten carbide is commonly prepared by starting with tungsten oxide, reducing it with $H_2$ and then reacting it with carbon black to produce the carbide. It has not, however, been possible to produce microfine powders and whiskers in this way.

Silicon carbide is traditionally formed by reacting silica and carbon in an arc furnace (Acheson process). Temperatures well over 2000° C. are employed and the silicon carbide product is formed as large lumps and is quite impure. To form a fine powder, the large lumps have to be ground to the desired particle size, but the extreme hardness of silicon carbide makes the grinding step difficult and expensive. Recently, a-Sic has been produced by heating mixtures of fine or colloidal silica and fine carbon. However, as the distribution of the reactants is essentially non-homogeneous, the product is not very pure. A further way of producing silicon carbide in the form of a fine powder involves reactions between a silicon halide and a hydrocarbon, or the degradation of polycarbosilanes. However, the production costs of such methods are extremely high compared to conventional solid-solid reactions.

Silicon carbide whiskers are also produced commercially from rice hulls. Rice hulls contain $SiO_2$ distributed in a carbonaceous matrix. This $SiO_2$ is converted to SiC at high temperature, but both the distribution and the amount of the $SiO_2$ present in rice hulls varies considerably and therefore the product quality is not controllable.

U.S. Pat. No. 4,444,894 issued on Apr. 24, 1984 to Robert G. Shaver illustrates a further method of forming silicon carbide, although it is the object of the patent to produce shaped articles made of a composite of carbon and silicon carbide rather than to produce fine silicon carbide powders. In this method, pulverized silica or hollow glass spheres are dispersed in a phenolic resin, the mixture is heated to high temperature in an inert atmosphere to carbonize the resin, and then the heating is further continued to cause the silica or glass and carbon to react to form silicon carbide. Hydrofluoric acid is then used to dissolve away unreacted silica or glass. However, the Shaver process does not form SiC in high yield (the conversion is generally of the order of 50%). Thus unreacted oxide remains present in fairly large amounts, and SiC particles of the desired degree of fineness and purity are not produced even if the unreacted carbon is removed.

SUMMARY OF THE INVENTION

Accordingly, it is an object of the present invention to provide a process for producing fine powders or whiskers of silicon carbide and metal carbides which can be carried out relatively inexpensively and which gives a product of high purity and the required degree of fineness.

According to the invention, there is provided a process for producing a carbide of silicon or a carbide-forming metal from a corresponding oxide, said process comprising: forming a uniform disperson of microfine particles of said oxide in a polymer having the following characteristics: (a) a molecular weight of at least 10,000 and a long chain structure of at least 200 monomer units, (b) a carbon yield of at least 30% by weight, and (c) a chemical structure which is infusible or which is capable of being rendered infusible, said dispersion being such that said particles are substantially unagglomerated and separated from each other by said polymer; carbonizing the resulting dispersion in an inert atmosphere in order to convert the polymer to carbon; heating the carbonized product in an inert atmosphere at high temperature to cause the oxide to react with said carbon to form a carbide; and optionally removing any remaining excess carbon from the resulting carbide product.

The invention also relates to the carbide powders and whiskers produced by the above method and in particular to microfine WC powder and whiskers which are believed to be novel products.

The polymer employed in the process is preferably one which has an affinity for the oxide. This means a polymer which is attracted to the oxide surfaces when the polymer is in solution or in the molten state. Another way of expressing this is to say that the electrokinetic potential ($\zeta$) of the polymer/oxide interface should be high. When this is the case, the polymer tends to coat the oxide particles and this effect may be greater than the Van der Waals forces which tend to attract oxide particles to each other and thus make them agglomerate.

In the following disclosure, when describing the starting material or the carbide product, the terms "powder" and "whiskers" are employed. The term "powder" is intended to represent a collection of generally non-elongated particles, whereas the term "whiskers" represents thin, elongated particles. The powder particles need not be spherical and may be irregular or slightly elongated, and the whiskers generally have an average aspect ratio of around 20–100, although this is not essential. The powders or whiskers are often described in the following as "microfine". This means that the powders have an average particle size of less than 5 microns (preferably less than one micron) and the whiskers generally have a diameter of less than 5 microns (preferably less than one micron).

The preferred way of forming the uniform dispersion of the oxide particles in the polymer is to form a solution of the polymer in a solvent, introduce the oxide particles into the solvent, agitate the solution to disperse the particles uniformly, and then remove the solvent from the solution. The solvent preferably has a lower affinity for the oxide than the polymer does. The solvent can be removed either by evaporation or by introducing the solution into a bath of a liquid non-solvent for the polymer, the non-solvent being miscible with the solvent. The use of a liquid non-solvent is preferred because it causes the polymer to precipitate or coagulate rapidly without disturbing the dispersion of the oxide particles.

An alternative way of forming the uniform dispersion of the oxide in the polymer is to mix the particles thoroughly with a polymer melt, followed by allowing the melt to cool. If necessary, plasticisers may be added to the polymer melt in order to make it more fluid and thus to permit the oxide particles to be uniformly distributed.

The carbonization step and the carbide-formation step may be carried out as a single combined step by gradually heating the polymer/oxide product so that the temperature rises first through the carbonization range and then continues to the carbide-forming range. This is possible because both reactions can be carried out in the same reactor under the same inert atmosphere. Incidentally, the term "inert", when used throughout this application to describe gaseous atmospheres, is not intended to mean only the noble gases, but any gases which do not interfere with the intended reaction under the conditions employed. Nitrogen and argon are the usual gases employed to form inert atmospheres.

When the carbide product is non-oxidizable (e.g. SiC, the most effective way to separate the carbide from the remaining carbon (if any) is to heat the carbon-containing product in an oxidizing atmosphere, such as air, in order to convert the carbon to gaseous carbon monoxide or carbon dioxide. When the carbon has been eliminated, the product tends to retain its original shape but very gentle pressure (e.g. by hand) causes the shaped product to disintegrate into a fine powder or whiskers.

If the carbide product is itself easily oxidizable, e.g. at a temperature of about 500° to 700° C., excess carbon cannot be removed by oxidation without decreasing the product yield. In these cases, substantially stoichiometrical ratios of the reactants are preferably used in order to produce a product which contains little or no excess carbon.

The invention, at least in its preferred forms, is capable of producing microfine carbide powders or whiskers of high purity at relatively low cost, and the basic process outlined above can be modified in ways which will be explained later to favour either the production of a powder or of whiskers.

DETAILED DESCRIPTION OF THE INVENTION

Figure 1:
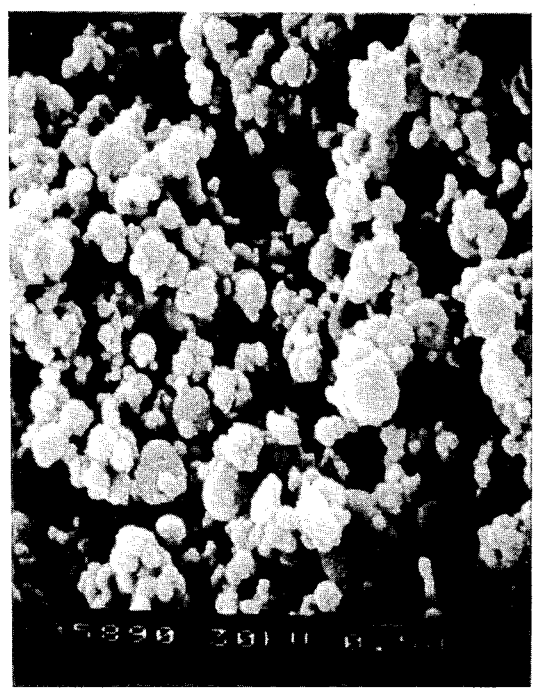
FIG. 1 is a scanning electron micrograph of fume silica which may be used as a starting material for the process of the present invention.

Stated in general terms, the preferred form of the invention involves suspending microfine oxide powders in a solution of a polymer having particular properties, coagulating or precipitating the solution by contacting it with a non-solvent for the polymer, converting the polymer to carbon, subjecting the oxide-containing carbon composite to high temperature in an inert atmosphere to cause the oxide to react with the carbon and hence to form a carbide and then removing the excess carbon by oxidizing it, or in the event of the carbide being oxidizable, using near stoichiometric ratios of the reactants to obtain a product containing little or no excess carbon.

Several features of the preferred process are critical to its success, i.e. to the formation of microfine carbide powders or whiskers in high yield without agglomeration either of the oxide particles used as the starting material or of the resulting carbide particles.

Firstly, it is important to use a microfine oxide powder as the starting material so that the oxide has a large surface to volume ratio and consequently a large oxide to carbon interface when the carbide producing reaction takes place.

The oxide employed in the present invention must be one which forms a fluid intermediate product (e.g. an oxide) during its conversion to the carbide. When this is the case, the oxide may react virtually stoichiometrically with the carbon. Moreover, when there is a fluid intermediate product, the final carbide particles do not necessarily correspond in size and shape to the original oxide particles, and thus it is possible to form whiskers, if desired, from non-whisker shaped oxide particles.

In the case of silica, the carbide is formed at high temperatures by the following reactions:

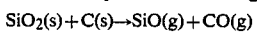

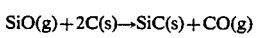

The intermediate product SiO (referred to hereinafter as the sub-oxide) is gaseous at the temperatures and pressures of the reaction. Other metal oxides, such as the oxides of aluminum, boron, tantalum, titanium, zirconium, hafnium, yttrium, lanthanum, chromium, niobium, molybdenum, tungsten and vanadium, also react with carbon via a volatile sub-oxide and are thus suitable in the present invention. For example, the volatile sub-oxide from $Al_2O_3$ is $Al_2O_2$ or $Al_2O$, the volatile sub-oxide from $B_2O_3$ is $B_2O_2$ or $B_2O$, etc.

A second important feature of the present invention is the choice of the polymer used as the carbon precursor. The polymer should have a molecular weight of at least 10,000 (preferably at least 50,000 and more usually at least 100,000), a long chain structure of at least 200 monomer units and preferably an affinity for the oxide particles (i.e. a tendency to coat the particles). When solutions or melts of such polymers are formed, the micro-fine oxide particles can be dispersed in the solution or melt by vigorous stirring to form stable suspensions in which the particles are separated from each other by surrounding polymer. The long-chain structure of the polymer is believed to hold the particles in suspension by virtue of the entanglement of the polymer chains with the particles. The oxide particles consequently have little or no tendency to agglomerate and they react individually with the carbon during the later carbideformation step. A surfactant may optionally be added to the polymer solution or melt to help keep the oxide particles separate and in suspension for long periods of time, but this is usually not required. Avoidance of agglomeration of the oxide particles is important because this results in incomplete reaction during the later carbide-formation step. Instead of reacting with carbon, agglomerated particles may fuse together, trapping carbon and impurities therein.

The polymer should also desirably be capable of generating a carbon structure of limited porosity upon being carbonized. This limits the loss of the volatile suboxide when the carbide forming reaction is carried out because the suboxide cannot easily escape before further reaction with carbon takes place. The polymer must also have a chemical structure which is infusible or which is capable of being rendered infusible by additional steps, e.g. cyclisation and/or cross-linking, etc. carried out prior to the carbonization treatment. The infusible structure ensures that the gases generated during carbonization evolve from a solid rather than a liquid so that the uniform distibution of oxide particles is not disturbed.

The polymer should have a high carbon yield of at least 30% by weight (and preferably at least 40% by weight) when subjected to carbonization. This ensures that each oxide particle is surrounded by sufficient carbon, i.e. at least the stoichiometrical amount, to permit substantially complete conversion to the sub-oxide (which is in turn converted to the carbide).

The polymer starting material should preferably be readily soluble in a solvent and should preferably be capable of producing a solution which (after the addition of the oxide and optional additional ingredients) has a viscosity in the range of 200–5000 cp at 25° C., and preferably 500–1500 cp at 25° C. A solution of this viscosity can easily be handled in the preferred process of the invention.

Suitable polymer materials for use in the present invention include polyacrylonitrile and its copolymers and terpolymers (collectively referred to hereinafter as PAN), cellulose and its derivatives (e.g. cellulose acetate and the material sold under the trade mark RAYON), polyvinyl alcohol and its copolymers and terpolymers (referred to hereinafter as PVA), polyarylether, polyacenaphthylene, polyacetylene, and the like. Additional suitable materials are also disclosed in "Precursors for Carbon and Graphite Fibers" by Daniel J. O'Niel, Itern. J. Polymeric Mater. Vol. 7, (1979) p. 203.

PAN is a known polymer having a high carbon yield of about 50–60% by weight widely used for textiles such as ORLON (trademark) manufactured by E.I. DuPont de Nemours and Company (the structure of this particular product is discussed in an article by R.C. Houtz, Textile Research Journal, 1950, p. 786). Textile grade PAN is commonly a copolymer of acrylonitrile and up to 25% by weight (more commonly up to 10% by weight and usually about 6% by weight) of methyl acrylate or methyl methacrylate. Textile grade PAN copolymers can be used in the present invention and are in fact preferred to PAN homopolymer because the additional units in the copolymer assist in the cyclization of the polymer when heated in air at about 200° C. for several hours, a step known as heat stabilization. Inexpensive waste PAN from the textile industry, such as the so-called "dryer fines" produced by textile companies, may be employed in the present invention.

Having chosen the appropriate starting materials, i.e. oxide and polymer, the process is then carried out and the individual steps of the preferred embodiment are described in detail below.

Firstly, the polymer is dissolved in the solvent to form a solution of the stated desired viscosity. The amount of polymer dissolved in the solvent determines the amount of oxide that can be subsequently added, but if too much polymer is dissolved, the viscosity of the solution may become too high for easy processing.

The oxide particles are then suspended in the polymer solution. This is preferably done with vigorous stirring in order to break up any lumps of oxide particles and thus to ensure that complete separation of the particles takes place. Mechanical stirring or agitation is advisable, e.g. by using a common blender or by employing an ultrasonic dispersion technique.

The amount of oxide added to the solution should be such that, upon later conversion of the polymer to carbon, the ratio of carbon to oxide is slightly in excess of the stoichiometrical ratio for carbide formation (e.g. 0–100% by weight excess carbon, but more usually 5 to 10% by weight excess carbon). For example, in the case of silica and PAN, the ratio (by weight) may be up to 1 part of silica per 1.3 parts of PAN.

Suitable solvents for PAN are dimethylformamide (DMF) dimethylsulfoxide (DMSO) and dimethylacetamide (DMAc). DMF is the preferred solvent and solutions of the required viscosity can be made by dissolving a sufficient amount of PAN in DMF to give a solution containing 5–20% by weight, more preferably 8–16% by weight and most preferably 8–12% by weight of PAN.

A suitable solvent for cellulose or cellulose derivatives is DMF containing about 10% by weight of LiCl. A suitable solvent for PVA is DMF.

A heat-decomposible blowing agent may optionally be incorporated into the polymer solution before the solution is contacted with the non-solvent bath. The blowing agent is preferably a finely divided solid which is insoluble in the polymer solution. As with the oxide particles, the long chain structure of the polymer holds the particles of blowing agent in uniform suspension in the solution. Suitable solid blowing agents include $(NH_4)_2CO_3$, $NH_4HCO_3$ and ammonium carbamate. Preferably, the solid blowing agent is used in the form of fine particles of less than 100 Tyler mesh in size. However, the actual size of the particles is less important than the requirement that they be uniformly distributed so that equal quantities of gas are generated from all parts of the solution.

As well as the blowing agent, additional materials may be suspended or dissolved in the polymer solution, if desired. For example, tar or pitch may be incorporated into the polymer solution. This can be beneficial because tar and pitch are inexpensive. The tar or pitch may be incorporated in amounts of up to one part by weight per part by weight of the polymer.

Solvent extraction (also known as "liquid drying") is chosen in the present invention as the preferred method of precipitating or coagulating the polymer from the solution because it tends not to disturb the uniform distribution of oxide particles. Solvent extraction is brought about by contacting the polymer/oxide dispersion with a liquid which is a non-solvent for the polymer and which is miscible with the solvent used for the solution. The coagulation or precipitation by this method takes place rapidly without causing the oxide particles to agglomerate, so the resulting product is a solidified polymer containing a uniform dispersion of oxide particles held separate from each other by encircling layers of polymer. The solvent extraction method also lends itself ideally to the formation of a hollow product, when desired, and to the control of void size, as will be explained later. In view of this, when choosing a polymer for the preferred process, an important consideration is the availability of a suitable non-solvent. It is advantageous, for example, to choose a solvent and non-solvent which are easily separable from each other (e.g. by distillation) so that one or both may be re-used. The non-solvent is also preferably one which is non-wetting with regard to the polymer solution.

When a heat-decomposible blowing agent is incorporated into the polymer solution, and when the temperature of the non-solvent bath exceeds the decomposition temperature of the blowing agent, gases are generated within the polymer solution simultaneously with the rapid coagulation or precipitation of the polymer, and a hollow product is formed instead of the solid product formed in the absence of a blowing agent. The advantages of forming a hollow product are described later.

The introduction of the polymer solution containing the oxide into the non-solvent bath can be carried out by any suitable method, e.g. by dividing the solution into droplets and allowing the droplets to fall into the bath or by extruding a constant stream of the solution into the bath below its surface. The former method results in the formation of small spheres of coagulated or precipitated polymer containing the oxide and the latter method results in the formation of a continuous rod, strand or sheet of the polymer containing the oxide. The product, in whatever form, may be solid or hollow depending upon whether or not a blowing agent is employed. The polymer solution containing the oxide can also be precipitated as a continuous hollow tube by passing the solution through an annular space followed by precipitation in the non-solvent.

When the solution contains cellulose in LiCl-DMF, the non-solvent may be water or a water-DMF mixture. When the solution contains PVA in DMF, the non-solvent may be acetone or methyl ethyl ketone. When the solution contains PAN in DMF, the non-solvent may be water or methanol. Suitability as a non-solvent for the PAN/DMF system appears to be associated with a high polarity and the presence of -OH groups. Acetone, for example, is not suitable as a non-solvent. Since water is inexpensive, it is the preferred non-solvent, but is advantageously mixed with the solvent itself, e.g. DMF, for the following reason. If the non-solvent alone is used in the bath, the solvent extracted from the droplets causes the solvent concentration in the bath to change rapidly, and this markedly affects the conditions under which the coagulation or precipitation of the polymer take place. When the bath already contains a large amount of solvent, the solvent concentration in the bath changes less rapidly as the process proceeds. Accordingly the bath advantageously contains 25% by weight or more of the solvent when the process is commenced. When the polymer is PAN and the solvent is DMF, the bath preferably contains 0-80% by weight of DMF in water, more preferably 25-60% by weight and normally about 40% by weight. If desired, the amount of solvent in the bath can be kept constant by continuously adding a suitable amount of the non-solvent.

When a blowing agent is employed, the temperature of the non-solvent bath should be above the decomposition temperature of the blowing agent and below the boiling temperature of the bath (preferably at least 20° C. below the boiling temperature). For example, when ammonium bicarbonate is used as the blowing agent and the bath contains DMF in water, the bath temperature is usually in the range of 50–70° C. Normally, a blowing agent having a decomposition temperature of at least 25° C. is employed in order to avoid decomposition before the polymer is introduced into the bath.

The conditions of the non-solvent bath, i.e. its composition and its temperature affect the rate of coagulation or precipitation of the polymer (i.e. the rate of change of viscosity), which should be sufficiently rapid. The polymer concentration in the solution, the amount of blowing agent (if any) and the amount of oxide also affect the nature of the precipitated or coagulated polymer/oxide intermediate product. By suitably varying these factors, a desirable intermediate product can be formed, e.g. one which has a suitable oxide to polymer ratio and (when hollow) a desirable wall thickness, etc.

After the polymer/oxide intermediate product has been formed in the non-solvent bath it is removed and dried under gentle heating, e.g. at about 100° C. in air or at a lower temperature in a vacuum.

The polymer/oxide intermediate product can then be subjected directly to the carbonization step if the polymer already has an infusible structure. However, the polymer may first require cross-linking or cyclization to make it infusible. Cellulose can be subjected directly to the carbonization treatment and so can PAN, but PAN may be subjected to a "heat stabilization" step in which the structure cyclizes, e.g. as follows:

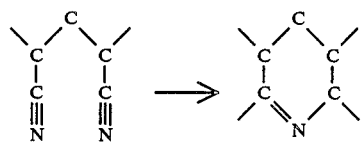

and consequently becomes infusible. This heat stabilization step, which is carried out by heating the polymer/oxide intermediate product in air at a temperature of about 200–220° C. for several hours (usually 8–16 hours), also increases the oxygen content of the polymer and thus the carbon yield from it. Alternatively, the polymer may be heated slowly in an $N_2$ atmosphere which helps to cyclise the polymer without oxygen absorption. The stabilization period may be reduced, if desired, by incorporating an antioxidant into the polymer solution prior to its coagulation or precipitation or at a later stage and then increasing the temperature in the stabilization treatment.

The carbonization step can then be carried out on the heat-infusible polymer/oxide intermediate product. The carbonization procedure differs according to whether it is desired to produce carbide powder or whiskers. If powder is favoured, it is preferable to use a solid polymer/oxide intermediate product, i.e. one produced without the use of a blowing agent. Moreover, the solid polymer/oxide intermediate product should preferably be divided into small particles, e.g. by cutting and grinding, and tightly packing the resulting particles in the vessel used for the carbonization treatment. The particles should preferably be reduced to less than 100 Tyler mesh in size before the packing is carried out. If whiskers are favoured, then a hollow polymer/oxide intermediate product should be employed without reduction of size. The reasons for these different procedures is explained in the discussion of the carbide-formation step.

Once the carbonization vessel has been filled, the intermediate product is raised to carbonization temperatures (500–700° C.) in an inert atmosphere (e.g. nitrogen or argon) in order to convert the polymer to carbon. Indeed, the carbonization step may be carried out as the temperature of the intermediate product is raised to the carbide-forming range because carbonization takes place quite rapidly. For example, if the temperature of the intermediate product is gradually raised to the carbide-forming range over a period of about 30 minutes, carbonization of the polymer is complete before the carbide starts to form.

Figure 2:
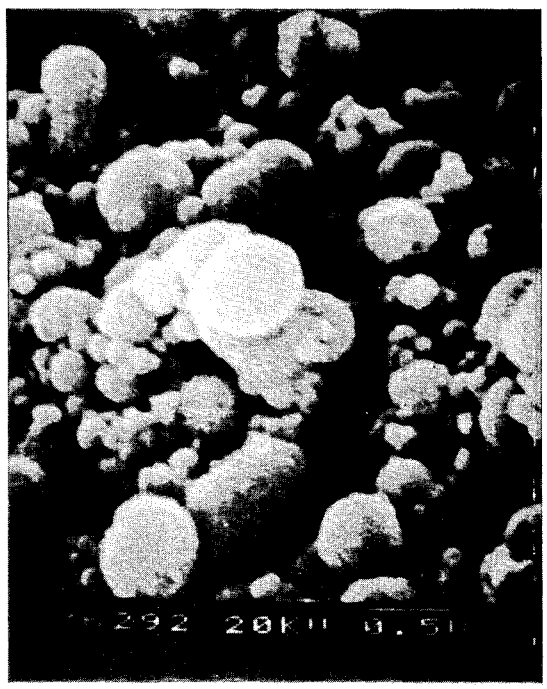
FIG. 2 is a photomicrograph of $SiO_2$ particles coated with PAN at 40,000X magnification.
Figure 3:
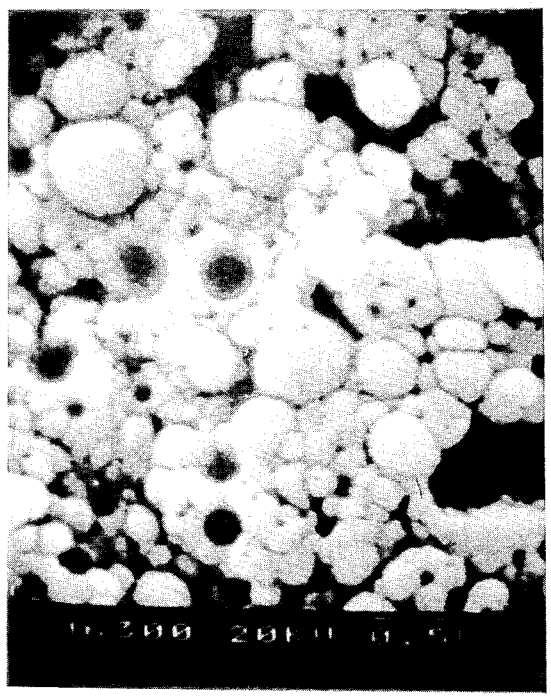
FIG. 3 is a photomicrograph of $SiO_2$ particles coated with carbon at 40,000X magnification.

The nature of the polymer and the manner of its precipitation or coagulation is such that the oxide-containing carbon intermediate product resulting from the carbonization contains microfine oxide particles coated with carbon and held quite separate from each other, thus permitting a good carbide-forming reaction and permitting the formation of a finely divided carbide product. This is quite different from carbon/oxide products made by directly mixing together and grinding the carbon and oxide starting materials. Such a product contains discrete particles of both oxide and carbon instead of carbon-coated oxide particles, so the contact between the carbon and oxide is not as intimate. For this reason, almost stoichiometrical amounts of carbon and oxide may be used in the present invention, whereas large excesses of carbon are required when separate particles of oxide and carbon are mixed together. FIGS. 2 and 3 are photomicrographs of polymer coated oxide particles and carbon-coated oxide particles, respectively, produced by the present invention. In FIG. 3, the black recesses are concave carbon layers exposed where oxide particles have been removed.

The carbide-formation step is carried out following the carbonizing step, or as already noted, as part of a single combined step in the same reaction vessel. The carbide formation step involves heating the carbon/oxide composite to high temperature (usually about 1,400° C. to 2,000° C.) in an inert atmosphere (e.g. nitrogen or argon) for several hours (e.g. up to 12 hours). The actual temperature employed and other reaction conditions depend on whether carbide powder or whiskers are favoured, and on the identity of the oxide employed as the starting material.

We have found that the presence of large internal voids in the carbon/oxide composite (i.e. voids having a size greater than about 100$\mu$) permits carbide whiskers to grow. Composites with smaller internal voids (i.e. less than about 70 $\mu$, and particularly less than about 50$\mu$) favour the formation of carbide powder. This is why the use of a solid polymer/oxide intermediate product is selected when powder is desired. After carbonization of the solid product, the carbon/oxide composite contains only small voids. The grinding and packing step also ensures that large voids are eliminated. On the other hand, the large internal voids of the hollow product allow whiskers to grow in the void spaces. However, as well as a large internal void, the composite resulting from the hollow product contains small voids in its walls and small particles tend to form in such voids. Accordingly, the wall thickness should be kept as thin as possible by suitably adjusting the ratio of the polymer and blowing agent in the starting solution. A relatively large amount of the blowing agent greatly inflates the polymer and thus produces thinner walls.

The reactor vessel should be tightly sealed except for an inlet for the inert gas and an exit for gaseous reaction products and the inert gas. The flow of inert gas should be minimized to prevent undue escape of the intermediate gaseous product (e.g. the sub-oxide) before it can react further with the carbon to form the solid carbide. Finally, it has also been found that the origins of the oxide particles used in the process can affect the process to some extent and also affect whether carbide powder or whiskers predominate. For example, when silica is used as the oxide starting material, it has been found that microfine particles produced by grinding large particles, and particularly those produced by grinding glass, are not very effective in the present invention. Instead, very small particles (e.g. about 10–20 nanometers) produced by the hydrolysis of silicates can be employed, particularly if powder formation is desired, or alternatively, so-called "fume silicas" may be employed, i.e. silica produced as a waste product from the carbothermal reduction of silica in an arc furnace to produce silicon and ferrosilicon alloys. Fume silicas are widely available and are inexpensive and they normally have the required microfine particle size (see FIG. 1). Fume silicas also contain impurities and it is found that these impurities may not only catalyse the carbide-formation reaction but also appear to catalyse the whisker formation mechanism, so the use of these silicas is particularly desirable when whisker formation is desired.

The main impurity of fume silicas is iron (as $Fe_2O_3$) normally present in a concentration of about 0.1 to 1.0% by weight, more usually about 0.2% by weight, based on the total weight of the fume silica. Fume silicas also contain other impurities which may affect the reaction and they do have an amorphous stucture which appears to be beneficial to the reaction.

In general, the process of the present invention is more likely to form carbide whiskers than powders when the following conditions apply:
(a) the oxide-containing polymer body is hollow rather than solid;
(b) the ratio of oxide to carbon is substantially stoichiometrical; and
(c) a non-stabilized (although infusible) polymer is employed for the carbonization and carbide-forming steps.

On the other hand, the process of the present invention is more likely to form carbide powder than whiskers when the following conditions apply:
(a) the oxide-containing polymer body is formed as a solid dense body and grinding is carried out to eliminate internal pores;
(b) a stabilized polymer is employed for the carbonization and carbide-forming reaction; and
(c) a slight excess of carbon over the oxide is employed.

It is another notable characteristic of the present invention that the particle size of the product is not dependent upon the size of the oxide used as the starting material because the oxide is converted to a fluid intermediate product. Moreover, steps can be taken to control the size of the carbide particles because it has been noted that the size of the product particles increases with increases in the reaction temperature. However, when lower temperatures are used in order to produce smaller particles, it is found that the reaction does not go to completion due to a slower rate of reaction. This problem can be overcome by employing a reaction having two or more steps carried out at different temperatures. A lower temperature can be used until the reaction is substantially complete and then the temperature can be raised in order to drive the reaction to completion. If larger particles are formed at the higher temperature, they form an insignificant proportion of the total.

When whiskers are being produced rather than powders, the same two stage procedure can be carried out to control the aspect ratio (l/d) of the whiskers.

The actual values of the lower temperature and the higher temperature depend on the carbide being formed, but can easily be obtained by simple experimentation.

The carbide-forming reaction may be carried out at atmospheric pressure or at higher pressures. A graphite reaction vessel is normally employed for the reaction, although this is not essential. The product may be a composite of carbide particles in a carbon matrix containing very little or no unreacted oxide, but as noted above, the excess carbon may be avoided or minimized by using stoichiometric or near stoichiometric quantities of the reactants. The carbide particles are substantially unagglomerated and can be easily separated. Gentle crushing may be required to form a powder, but this is quite different from the grinding steps necessary with conventional carbide-formation methods.

Any excess carbon can be removed from the carbide/carbon composite by oxidation of the carbon to carbon monoxide or carbon dioxide in those cases where the carbide is non-oxidizable. This may be carried out by heating the composite in air at a temperature of about 500 to 800° C. for several hours (e.g. about 2-10 hours). The carbon is quite easy to remove because it coats the carbide particles rather than being trapped within agglomerated lumps of the carbide product.

Figure 4:
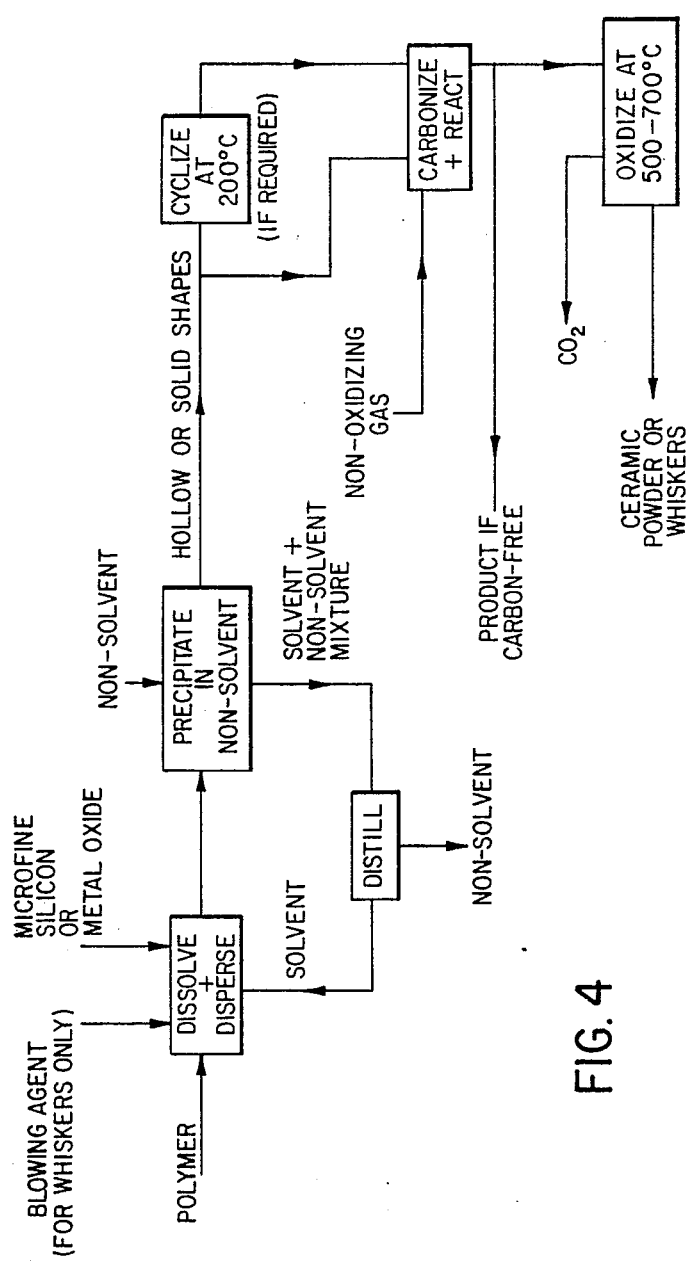
FIG. 4 is a drawing illustrating the steps in the preferred process according to the invention.

The preferred form of the invention is summarized in schematic form in FIG. 4 of the accompanying drawings.

When the polymer/oxide intermediate product is formed by dispersing the microfine oxide particles in a polymer melt, high torque mixing equipment may be required because of the high viscosities normally encountered. Plasticizers may be used to reduce the viscosities and only those polymers having relatively low viscosities in the molten state should be-employed. If the dispersion step is carried out for a suitable length of time, complete separation of the oxide particles can be achieved.

The invention is illustrated in further detail by the following Examples.

EXAMPLE 1 - FORMATION OF SiC WHISKERS

Figure 5:
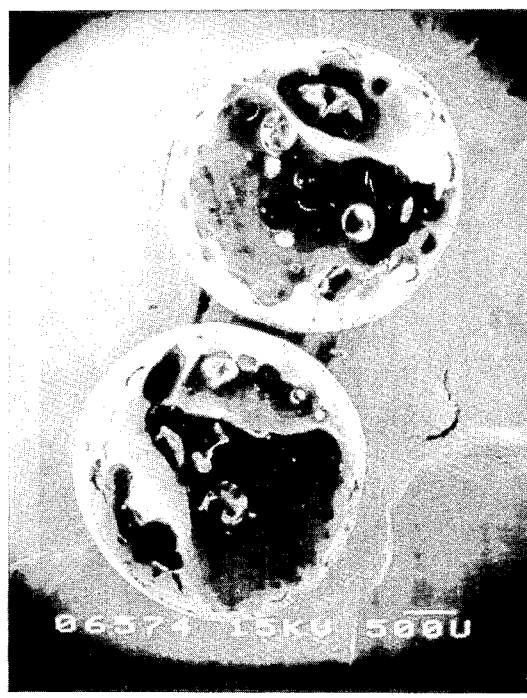
FIG. 5 shows sectioned spheres made of $SiO_2$ particles embedded in PAN.
Figure 6:
FIG. 6 is a photomicrograph showing a sectioned SiC sphere at 35,000X magnification.

Precipitated silica sold under the trade mark Degussa FK320 was dispersed in a solution of PAN 10% by weight in DMF. The ratio of silica to PAN was maintained at 3:4. The mixture was stirred in a blender for a few minutes. Two percent $(NH_4)_2CO_3$ by weight was added to form hollow spheres. This suspension was passed through an orifice and the spheres were precipitated in a bath containing 50% DMF and 50% water maintained at 60° C. The hollow spheres thus formed were stabilized at 210° C. for 16 hours. FIG. 5 is a photomicrograph showing two sectional PAN/silica spheres and the large internal voids can be readily seen. The stabilized spheres were at reacted 1850° C. for 4 hours. The $SiO_2$ was converted to SiC whiskers.

EXAMPLE 2 - FORMATION OF SiC WHISKERS

Fume silica (having a primary particle size below 1 micron) produced as a waste product of the ferrosilicon industry and having the following composition (by weight)

$SiO_2 = 91.7\%$
$Al_2O_3 = 0.21\%$
$Fe_2O_3 = 0.19\%$
$MgO = 0.68\%$
$Na_2O = 0.15\%$
$K_2O = 1.15\%$ was used as the oxide starting material.

Polyacrylonitrile (ORLON ® A-7 powder having a molecular weight of about 100,000) was used as the polymer and was dissolved in DMF to form a 10% by weight solution. The fume silica was dispersed in the polymer solution in a ratio by weight of PAN to silica of 8 : 7, using a blender operated for 10 minutes to assure a uniform dispersion. The viscosity of the suspension was approximately 500 cp at 25° C. An amount, representing 2% by weight of the disperion of $NH_4HCO_3$ was added as a blowing agent. The suspension was divided into droplets by passing it through an orifice having an internal diameter of 2 mm, and the droplets were introduced into bath containing a 50:50 mixture by weight of DMF and water maintained at 60° C. The blowing agent decomposed at this temperature just as the polymer was precipitated or coagulated to form a film of PAN at the surface of the droplets, resulting in the formation of hollow spheres. The walls of the spheres were made of $SiO_2$ in PAN in the same ratio as in the dispersion.

The spheres were removed from the bath, washed and dried at 110° C. for 4 hours. The resulting spheres were heated up to 1600° C. in an induction furnace under $N_2$ in about 3.5 hours and maintained at this temperature for an additional two hours. This brought about carbonization of the PAN and reaction between the silica and carbon.

The furnace was cooled while being flushed with $N_2$ and the product was then oxidized in air at 480° C. to 500° C. for 7 hours to remove excess carbon. The resulting SiC was analysed as predominantly $\beta$-SiC with a small percentage of $\alpha$-SiC. No impurities were detected by X-ray diffraction analysis.

The product still retained a spherical shape and FIG. is a photomicrograph of a section through one of the spheres.

Figure 7:
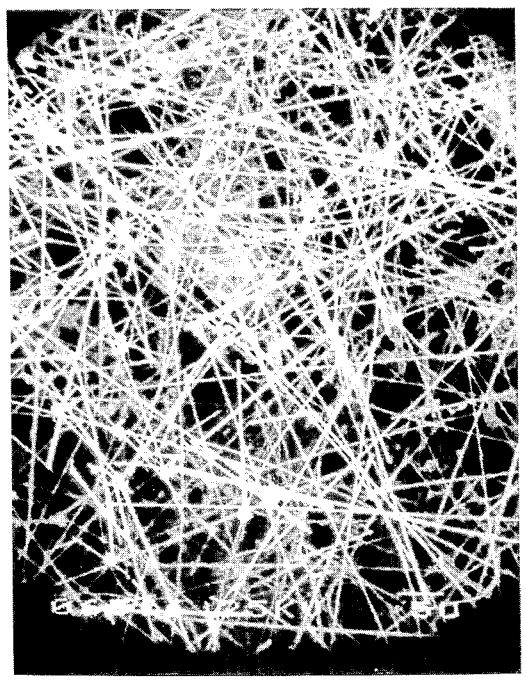
FIG. 7 shows the SiC whiskers from the sphere of FIG. 6 at an extra 2000X magnification.

The resulting SiC whiskers in the central void are shown on an enlarged scale in FIG. 7. The diameter of the whiskers was about 0.3–0.6 $\mu$.

EXAMPLE 3 - FORMATION OF SiC POWDER

Fume silica from Si metal production and PAN (ORLON ® A-7) were used as the starting materials. The PAN was dissolved in DMF to form a 12% by weight solution. The fume silica was dispersed in the solution in a weight ratio of $SiO_2$ to PAN of 6:7. Dense cylindrical shapes were precipitated by extruding the suspension through an orifice having an internal diameter of 2 mm into a bath of $DMF:H_2O$ (60:40 by weight) maintained at room temperature. The polymer product was washed, dried and stabilized at 210° C. for 16 hours. The stabilized product was crushed to −100 Tyler mesh powder which was packed into a graphite crucible and heated to 1600° C. over about 3 hours and then maintained at this temperature for 4 hours to bring about carbonization of the polymer and reaction between the silica and carbon.

The resulting product was then oxidized in air at 700° C. to give a silicon carbide powder having a primary particle size of less than $0.1\mu$.

Analysis by X-ray diffraction showed the presence of no impurities.

EXAMPLE 4 - FORMATION OF SiC POWDER

Precipitated solid $SiO_2$ sold under the trademark DEGUSSA FK320 (primary particle size 18 nm) having the following composition by weight was used as a starting material:

$SiO_2 = 98\%$
$Na_2O = 1\%$
$Fe_2O_3 = 0.03\%$
$SO_3 0.8\%$

PAN was used as the other starting material and stabilized hollow spheres were prepared by the procedure of Example 1. The spheres were then crushed and heated to 1800° C. in an induction furnace over 3-½ hours and were cooled immediately. The product was then oxidized at 800° C. for 7 hours to remove the excess carbon.

Figure 8:
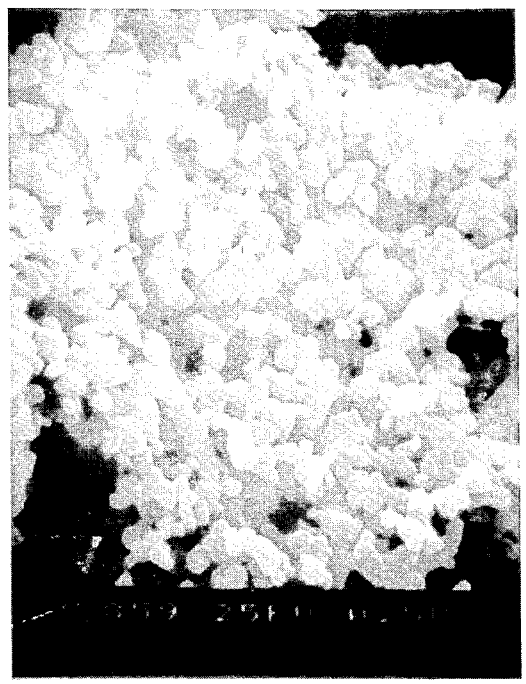
FIG. 8 shows SiC powder produced by the invention at 40,000X magnification.

X-ray diffraction analysis of the product indicated the presence of only predominantly β-SiC. A photomicrograph of the product is shown in FIG. 8 from which it can be seen that the particles are uniformly sized at $0.3-0.5\mu$.

EXAMPLE 5 - FORMATION OF SiC WHISKERS

In this experiment, SiC whiskers were formed employing PAN as the polymer without heat stabilizing the PAN prior to carbonizing it.

Fume $SiO_2$ was dispersed in a 10% solution of PAN in DMF to obtain a ratio of $SiO_2$ to PAN of 7:8 (viscosity 500 cp). Extruded shapes of 2 mm diameter were prepared using a syringe and precipitating the polymer in a water bath at room temperature. The extruded wire shapes were dried at 100° C. and heated to 1550° C. and held at this level for 2.5 hours under an $N_2$ atmosphere. PAN was not stabilized but some non-oxidative stabilization took place as the temperature was raised for the carbonization step and this rendered the PAN infusible. A large number of voids were present in the extruded shape as a result of rapid precipitation at the surface. This helped to promote the growth of whiskers.

Weight of extruded wire shapes: 5.07 g
Weight after reaction at 1550° C.: 1.24 g Part of the product was oxidized at 700° C. for 2 hours to remove excess carbon (which was 7% of the weight of the final product). The SiC yield based on initial $SiO_2$ present was 74%, the rest was probably lost as SiO.

The resulting whiskers formed had an average aspect ratio of about 50 and an average diameter of $0.6\mu$.

EXAMPLE 6- FORMATION OF TiC POWDER

Figure 9:
FIG. 9 shows TiC powder produced by the invention.

Microfine $TiO_2$ (Fisher) was dispersed in a 12% solution of PAN in DMF, the ratio of $TiO_2$ to PAN being 8:6.5 respectively. The dispersion was extruded in the form of solid noodle-like shapes into a bath containing DMF in water (40:60) at room temperature. The noodles were removed from the bath, dried and reacted at 1700° C. for 3 hours under argon gas. TiC particles having a size of about $0.6\mu$ (FIG. 9) were produced.

EXAMPLE 7- FORMATION OF TiC POWDER

The procedure of Example 6 was repeated except that the reaction temperature was 1600° C. The TiC produced had a particle size of $0.5\mu$.

EXAMPLE 8- FORMATION OF WC POWDER

Microfine $WO_3$ particles were dispersed in a 12% PAN/ DMF solution and precipitated in a 40% DMF/water bath at room temperature to form noodle shapes of a dispersion of $WO_3$ in PAN. The ratio of $WO_3$ to PAN was 2.55:1, i.e. the stoichiometrical ratio required for the subsequent carbide-forming reaction.

The dried noodles were stabilized by heating them to about 200° C. in air for 8 hours in order to increase the carbon yield from the PAN and to make the PAN infusible. The stabilized noodles were then reacted at a temperature of about 1400° C. in an atmosphere of nitrogen for 2 hours.

Figure 10:
FIG. 10 shows WC powder at 10,000X magnification produced by the invention.

A submicronic particulate product was obtained which was analyzed by XRD and found to be WC and no impurities were detected. The WC had a particle size of about $0.4\mu$ and a photomicrograph of the particles at 10000X magnification is shown in FIG. 10.

Tungsten carbide in submicronic particulate form is believed to be a novel product.

EXAMPLE 9- FORMATION OF TANTALUM CARBIDE POWDER

Microfine $Ta_2O_5$ powder was dispersed in a 12% solution of PAN in DMF in a weight ratio of $Ta_2O_5$:PAN of 2.9:1. The solution was extruded into a bath containing a 35% DMF solution in water to form noodle shapes of 3mm diameter.

The noodles were dried and stabilized by heating them in air at 200° C. for 8 hours and then the stabilized noodles were calcined at 1400° C. for 4 hours in an atmosphere of argon.

The resulting particulate product was analyzed by XRD and was found to be predominantly TaC. The particle size was about 0.5 micron as observed by SEM.

EXAMPLE 10- ZIRCONIUM CARBIDE POWDER

Microfine $ZrO_2$ was dispersed in a 12% solution of PAN in DMF in a ratio of $ZrO_2$:PAN of 1.88:1. Noodle shapes of approximately 3–4 mm diameter were precipitated by extruding the solution into a bath of DMF/water (40:60).

The noodles were dried and stabilized by heating them in air at 200° C. for about 12 hours.

The stabilized noodles were reacted in an induction furnace at about 1850° C. for 4 hours under an argon atmosphere.

Figure 11:
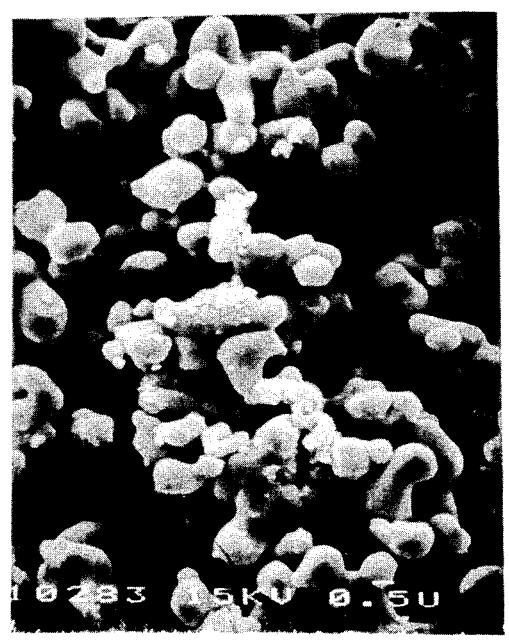
FIG. 11 shows a ZrC powder product produced by the invention.

The powder product was analyzed by XRD and found to be predominantly zirconium carbide. The particle size was found by SEM to be about $0.5\mu$ (FIG. 11). The reaction temperature employed resulted in some sintering of the powder product.

EXAMPLE 11

Microfine $WO_3$ powder was mixed with a 12% solution of PAN in DMF, the ratio of $WO_3$ to PAN being 2.5:1. A powder of $NH_4HCO_3$ was mixed with the solution and then droplets of the resulting mixture were allowed to fall into a bath containing 40% DMF in water held at a temperature of 50 to 60° C. The droplets expanded and solidified to form hollow spheres of $WO_3$ in PAN.

The hollow spheres were heated under an atmosphere of nitrogen to a temperature of 1500° C. for about 3 hours.

The resulting product predominantly contained whiskers of WC having an average aspect ratio of about 55 and an average diameter of about 0.5 $\mu$.

What we claim is:

1. A process for producing substantially unagglomerated particles of a carbide of silicon or a carbide-forming metal capable of forming a gaseous sub-oxide selected from the group consisting of aluminum, boron, tantlum, titanium, zirconium, hafnium, yttrium, lanthanum, chromium, niobium, molybdenum, tungsten and vanadium from a corresponding oxide, said process comprising:
   forming a uniform dispersion consisting essentially of particles having an average size of less than two microns of said oxide in a polymer having the following characteristics: (a) a molecular weight of at least 10,000 and a long chain structure of at least 200 monomer units and (b) a carbon yield of at least 30% by weight.
   said dispersion being formed by dissolving the polymer in a solvent having a lower affinity for said oxide than the polymer, introducing the oxide particles into the resulting solution, agitating the solution to disperse the particles uniformly, and then removing the solvent from the solution such that said particles are substantially unagglomerated and separated from each other by said polymer;
   carbonizing the resulting dispersion in an inert atmosphere in order to convert the polymer to carbon;
   heating the carbonized product in an inert atmosphere in the presence of a catalyst for the formation of said sub-oxide at a first temperature, which results in the formation of carbide particles or whiskers having an average particle diameter of less than two microns, then raising the temperature to a second temperature to drive the reaction to completion; and
   removing any remaining excess carbon from the resulting carbide product by oxidizing the carbon.

2. A process according to claim 1 wherein the solvent is removed from the solution by introducing the solution into a bath of a liquid non-solvent for the polymer, which nonsolvent is miscible with the solvent.

3. A process according to claim 1, wherein said polymer is selected from the group consisting of polyacrylonitrile, copolymers thereof and terpolymers thereof.

4. A process according to claim 3 wherein said copolymer contains up to 25% by weight of units derived from a copolymerizable monomer.

5. A process according to claim 3 wherein said copolymer contains up to 10% by weight of units derived from a copolymerizable monomer.

6. A process according to claim 3 wherein said copolymer contains about 6% by weight of units derived from a copolymerizable monomer.

7. A process according to claim 4 wherein the copolymerizable monomer is selected from the group consisting of methyl acrylate and methyl methacrylate.

8. A process according to claim 3, wherein the polymer/oxide dispersion is cyclized by heating in air before subjecting the dispersion to the carbonizing step.

9. A process according to claim 2, wherein the polymer is selected from the group consisting of polyacrylonitrile, copolymers thereof and terpolymers thereof, the solvent is dimethylformamide and the non-solvent is selected from the group consisting of water and a mixture of water and dimethylformamide.

10. A process according to claim 1 wherein the polymer is selected from the group consisting of cellulose, cellulose derivatives, polyvinyl alcohol, copolymers containing units derived from vinyl alcohol, terpolymers containing units derived from vinyl alcohol, polyarylethers, polyacenaphthylene, and polyacetylene.

11. A process according to claim 1 wherein said dispersion is heated to a temperature within the range of 500–700° C. in order to carbonize the polymer.

12. A process according to claim 1, wherein said first and second temperatures are within the range of 1400° to 2000° C."

13. A process according to claim 2 wherein a solid particulate blowing agent is incorporated into said solution before the solution is introduced into the bath and wherein the temperature of the bath is maintained above a decomposition temperature of the blowing agent so that said polymer/oxide dispersion is formed as a hollow product.

14. A process according to claim 1 wherein the polymer/oxide dispersion is ground to form particles which are then packed together before the dispersion is subjected to the carbonizing and carbide-forming step.

15. A process according to claim 1 wherein said oxide is selected from the group consisting of the oxides of silicon, titanium, tungsten, zirconium and tantalum.

16. A process according to claim 1 wherein said oxide is $SiO_2$.

17. A process according to claim 1 wherein said oxide is $TiO_2$.

18. A process according to claim 1 wherein said oxide is $WO_3$.

19. A process according to claim 1 wherein said oxide is $Ta_2O_5$.

20. A process according to claim 1 wherein said oxide is $ZrO_2$.

* * * * *